(12) United States Patent
Iguchi (10) Patent No.: US 9,276,145 B2
(45) Date of Patent: Mar. 1, 2016

(54) ARRAY-TYPE LIGHT-RECEIVING DEVICE

(71) Applicant: SUMITOMO ELECTRIC INDUSTRIES, LTD., Osaka (JP)

(72) Inventor: Yasuhiro Iguchi, Yokohama (JP)

(73) Assignee: SUMITOMO ELECTRIC INDUSTRIES, LTD, Osaka (JP)

( * ) Notice: Subject to any disclaimer, the term of this patent is extended or adjusted under 35 U.S.C. 154(b) by 0 days.

(21) Appl. No.: 14/703,537

(22) Filed: May 4, 2015

(65) Prior Publication Data

US 2015/0325726 A1 Nov. 12, 2015

(30) Foreign Application Priority Data

May 8, 2014 (JP) ................................. 2014-097015

(51) Int. Cl.
*H01L 31/00* (2006.01)
*H01L 31/0352* (2006.01)
*H01L 27/146* (2006.01)
*H01L 31/0304* (2006.01)

(52) U.S. Cl.
CPC .... *H01L 31/035236* (2013.01); *H01L 27/1463* (2013.01); *H01L 31/03046* (2013.01)

(58) Field of Classification Search
CPC ................. H01L 31/035236; H01L 31/03046; H01L 27/1463
USPC .................................................. 257/21, 443
See application file for complete search history.

(56) References Cited

U.S. PATENT DOCUMENTS

| 2009/0101925 A1* | 4/2009 | Shakuda | H01L 33/16 257/94 |
| 2010/0044677 A1* | 2/2010 | Nagai | B82Y 20/00 257/21 |
| 2014/0319464 A1* | 10/2014 | Iguchi | H01L 27/14647 257/21 |

FOREIGN PATENT DOCUMENTS

JP 4771185 9/2011

OTHER PUBLICATIONS

Boisvert, J., Isshiki, T., Sudharsanan, R., Yuan, P., McDonald, P., "Performance of Very Low Dark Current SWIR PIN Arrays", *Proceeding of SPIE* vol. 6940, 69400L-1 through 69400L-8 (2008).
Rehm, R., Walther, M., Schmitz, J., Rutz, F., Wörl, A., Scheibner, R., Ziegler, J., "Type-II Superlattics—The Fraunhofer Perspective", *Proceeding of SPIE* vol. 7660, 76601G-1 through 76601G-12 (2010).

* cited by examiner

*Primary Examiner* — Trung Q Dang
(74) *Attorney, Agent, or Firm* — Smith, Gambrell & Russell LLP.

(57) ABSTRACT

An array-type light-receiving device includes a semiconductor substrate having a cleavage direction; a light-receiving surface disposed on the semiconductor substrate; and a plurality of pixels two-dimensionally arranged on the light-receiving surface in a first array direction and a second array direction, each of the pixels including a staked semiconductor layer including an optical absorption layer. The first and second array directions are tilted relative to the cleavage direction of the semiconductor substrate at a predetermined angle α, as viewed from above the light-receiving surface. In addition, the first and second array directions and the cleavage direction extend along the light-receiving surface.

5 Claims, 8 Drawing Sheets

ARRAY-TYPE LIGHT-RECEIVING DEVICE

BACKGROUND OF THE INVENTION

1. Field of the Invention

The present invention relates to an array-type light-receiving device.

2. Description of the Related Art

Japanese Patent No. 4771185 discloses a technique that relates to a light-receiving device having photosensitivity in the near-infrared region. The light-receiving device includes a stacked semiconductor layer on a semiconductor substrate. The stacked semiconductor layer includes an optical absorption layer and a diffusion concentration distribution control layer. The optical absorption layer includes a p-n junction. In addition, the optical absorption layer includes a multi quantum well (MQW) structure. The diffusion concentration distribution control layer is in contact with a surface of the optical absorption layer opposite the semiconductor substrate. The diffusion concentration distribution control layer has a smaller bandgap energy than that of the semiconductor substrate. The p-n junction is formed in the optical absorption layer by selective diffusion of a p-type impurity such as zinc (Zn) impurity. The impurity concentration in the diffusion concentration distribution control layer is reduced toward the optical absorption layer. The impurity concentration in the diffusion concentration distribution control layer is $5 \times 10^{16}/$cm3 or less. The semiconductor substrate is an InP substrate.

An array-type optical detector on a S-doped InP substrate is disclosed in Joseph Boisvert, Takahiro Isshiki, Rengarajan Sudharsanan, Ping Yuan, Paul McDonald, "Performance of Very Low Dark Current SWIR PIN Arrays", Proceeding of SPIE Vol. 6940, 69400L-1 (2008). In order to form the array-type optical detector, a stacked semiconductor layer is formed on a 2-inch S-doped InP substrate by a metal-organic vapor phase epitaxy (MOVPE) method. The InP substrate has a (100) plane orientation. An array detector on a GaSb substrate is disclosed in Robert Rehm, Martin Walthera, Johannes Schmitza, Frank Rutza, Andreas Worla, Ralf Scheibnerb, Johann Zieglerb, "Type-II Superlattices—The Fraunhofer Perspective", Proceeding of SPIE Vol. 7660, 76601G-1 (2010). A stacked semiconductor layer for forming the array detector is formed on a 3-inch GaSb substrate by a molecular beam epitaxial growth (MBE) method.

SUMMARY OF THE INVENTION

Hybrid optical detectors include an array-type light-receiving device electrically coupled to a read-out circuit through bumps. The array-type light-receiving device includes monocrystalline layers including an optical absorption layer formed by epitaxial growth on a III-V group compound semiconductor substrate, such as InP, GaAs, or GaSb. The read-out circuit is formed of a silicon semiconductor on a silicon substrate. In order to decrease the dark current of a hybrid optical detector, the hybrid optical detector is cooled with a thermoelectric cooler, such as a Peltier device or a Stirling cooler. Due to a difference between the thermal expansion coefficient of a semiconductor material of the array-type light-receiving device and the thermal expansion coefficient of a material (silicon) of the read-out circuit, a crack is introduced in the array-type light-receiving device by repeating temperature cycle. Specifically, the array-type light-receiving device is formed on the III-V group compound semiconductor substrate having a (100) plane orientation. In this case, the crack is easily introduced along a [011] or [0-11] crystallographic direction of the substrate. A plurality of pixels in the array-type light-receiving device is arranged in an array in the [011] or [0-11] crystallographic direction. Therefore, the array-type light-receiving device is broken by the crack introduced along the [011] or [0-11] crystallographic direction.

An array-type light-receiving device according to one aspect of the present invention includes a semiconductor substrate having a cleavage direction; a light-receiving surface disposed on the semiconductor substrate; and a plurality of pixels two-dimensionally arranged on the light-receiving surface in a first array direction and a second array direction, each of the pixels including a staked semiconductor layer including an optical absorption layer. The first and second array directions are tilted relative to the cleavage direction of the semiconductor substrate at a predetermined angle α, as viewed from above the light-receiving surface. In addition, the first and second array directions and the cleavage direction extend along the light-receiving surface.

BRIEF DESCRIPTION OF THE DRAWINGS

FIGS. 3A and 3B are schematic views illustrating the pixel width and pixel intervals of an array-type light-receiving device according to an embodiment of the present invention.

DESCRIPTION OF THE PREFERRED EMBODIMENTS

Description of Embodiments of Present Invention

First, the embodiments of the present invention will be described below. An array-type light-receiving device according to one aspect of the present invention includes a semiconductor substrate having a cleavage direction; a light-receiving surface disposed on the semiconductor substrate; and a plurality of pixels two-dimensionally arranged on the light-receiving surface in a first array direction and a second array direction, each of the pixels including a staked semiconductor layer including an optical absorption layer. The first and second array directions are tilted relative to the cleavage direction of the semiconductor substrate at a predetermined angle α, as viewed from above the light-receiving surface. In addition, the first and second array directions and the cleavage direction extend along the light-receiving surface.

In this array-type light-receiving device, the array directions of the plurality of pixels do not coincide with the cleavage directions of the array-type light-receiving device and are tilted relative to the cleavage directions, as viewed from above the light-receiving surface. Thus, the array-type light-receiving device has improved rigidity when the pixels are fixed to a read-out circuit, for example, through bumps. Even when the thermal expansion coefficients of a semiconductor material of the array-type light-receiving device and a material of the read-out circuit are different from each other, cracking of the array-type light-receiving device is prevented, and the yields of these devices are improved.

In an array-type light-receiving device according to one aspect of the present invention, preferably, the angle α formed by a reference direction and the cleavage direction satisfies the relational expression: $L2/L1 \leq \tan(\alpha) \leq L1/L2$ wherein the reference direction is the first or second array direction, L1 represents a length of one side of each of the plurality of pixels in the reference direction, L2 represents a distance L2 between adjacent pixels of the plurality of pixels in the reference direction, and tan(ca) represents a tangent of the angle α. Because the array directions of the plurality of pixels are sufficiently tilted relative to the cleavage directions of the array-type light-receiving device, as viewed from above the light-receiving surface, the array-type light-receiving device has improved rigidity.

An array-type light-receiving device according to one aspect of the present invention preferably further includes a plurality of mesa portions disposed on the substrate. Each of the mesa portions includes the stacked semiconductor layer. Each of the pixels is defined by a corresponding one of the plurality of mesa portions. In addition, the plurality of pixels is separated from each other by a groove disposed between the mesa portions.

In an array-type light-receiving device according to one aspect of the present invention, the semiconductor substrate may be composed of InP, and the optical absorption layer may include one of an InGaAs/GaAsSb multi quantum well structure and a GaInNAs/GaAsSb multi quantum well structure.

In an array-type light-receiving device according to one aspect of the present invention, the substrate may be composed of GaSb, and the optical absorption layer may include one of an InAs/GaSb multi quantum well structure and an InAsSb/InGaSb multi quantum well structure.

An array-type light-receiving device according to one aspect of the present invention may further include a selective diffusion mask disposed on a top surface of the staked semiconductor layer, the selective diffusion mask including a plurality of openings; and a plurality of selective diffusion regions extending from the top surface of the staked semiconductor layer toward the optical absorption layer. The selective diffusion regions may include a p-type impurity diffused from the top surface of the staked semiconductor layer through the opening of the selective diffusion mask. In addition, each of the pixels may be defined by a corresponding one of the plurality of selective diffusion regions.

Details of Embodiments of Present Invention

Specific examples of an array-type light-receiving device according to an embodiment of the present invention will be described below with reference to the accompanying drawings. The present invention is defined by the appended claims rather than by these embodiments. All modifications that fall within the scope of the claims and the equivalents thereof are intended to be embraced by the claims. If possible, like reference numerals designate like parts throughout the drawings, and the description will not be repeated.

Figure 1A:
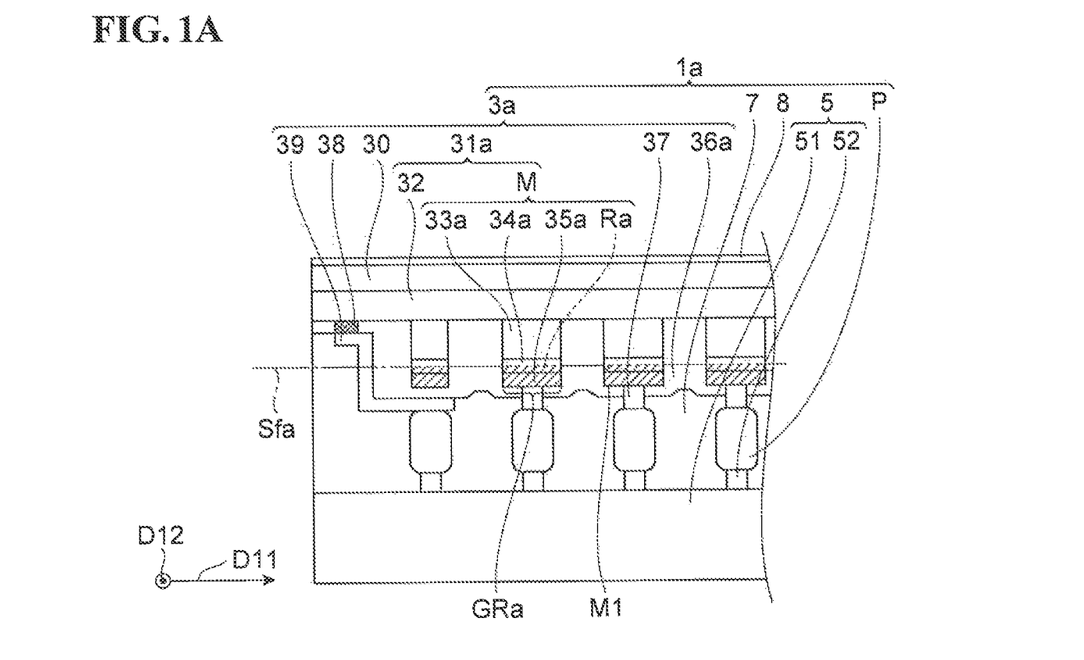
FIGS. 1A and 1B are explanatory views of array-type light-receiving devices according to two embodiments of the present invention.
Figure 2:
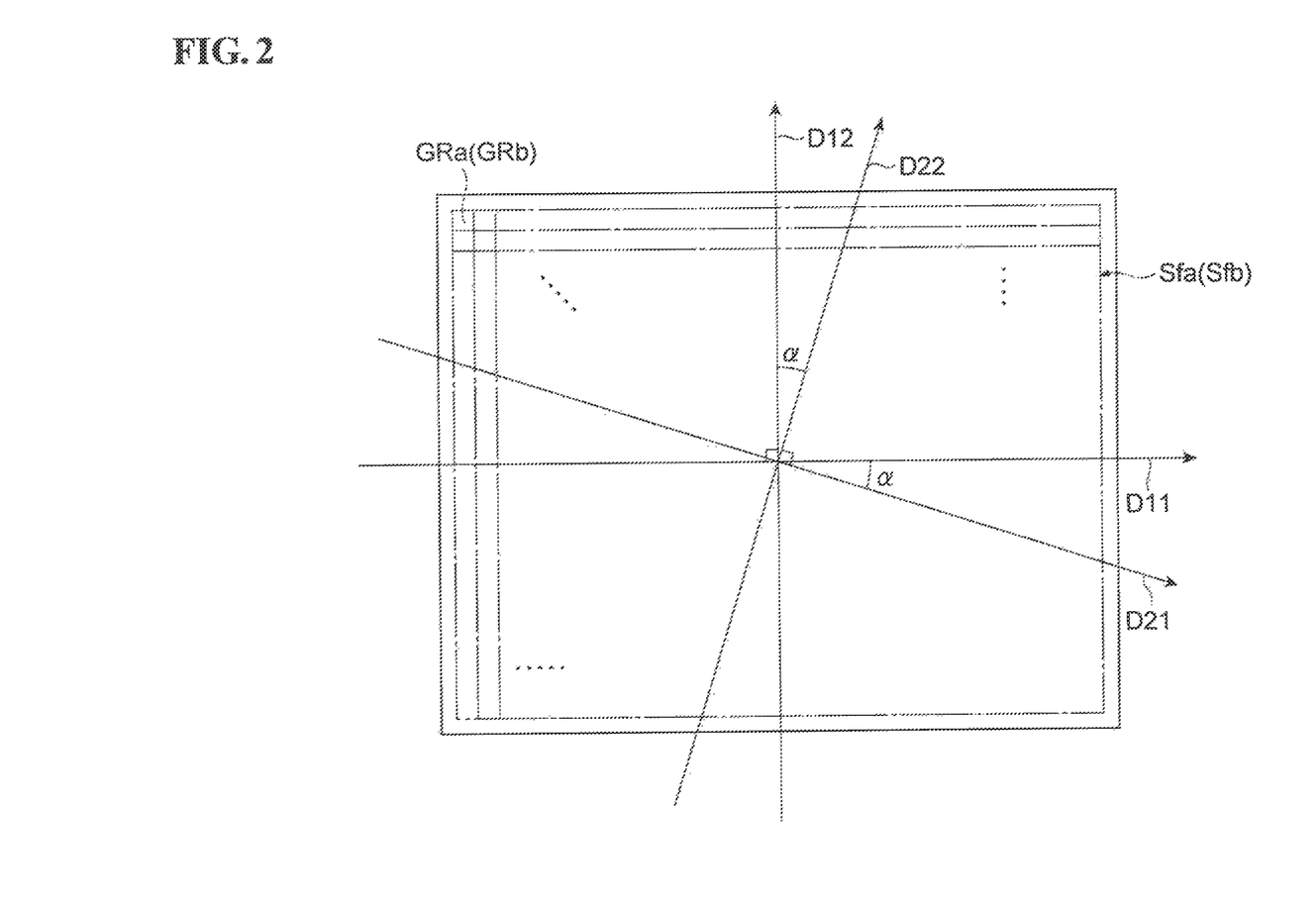
FIG. 2 is an explanatory view of a light-receiving surface of an array-type light-receiving device according to an embodiment of the present invention.

An optical detector 1a illustrated in FIG. 1A includes an array-type light-receiving device 3a, a read-out circuit 5, an underfill resin 7, and a plurality of bumps P. The array-type light-receiving device 3a includes a light-receiving surface Sfa and a plurality of pixels GRa. The read-out circuit 5 is fixed to the array-type light-receiving device 3a through the bumps P. The bumps P are disposed between the array-type light-receiving device 3a and the read-out circuit 5. The underfill resin 7 is disposed between the array-type light-receiving device 3a, the read-out circuit 5, and the bumps P. Each of the pixels GRa of the array-type light-receiving device 3a includes a mesa portion M. FIG. 1A is a schematic view of the interior of the optical detector 1a along a plane perpendicular to a plane defined by array directions D11 and D12 of the pixels GRa (a plane parallel to the light-receiving surface Sfa). The light-receiving surface Sfa extends along a plane defined by the array direction D11 and the array direction D12. As illustrated in FIG. 2, the pixels GRa are arranged in a tetragonal lattice on the light-receiving surface Sfa along the array direction D11 and the array direction D12 that intersect at right angles. As viewed from above the light-receiving surface Sfa, the array direction D11 and the array direction D12 are tilted relative to a cleavage direction D21 and a cleavage direction D22 of the array-type light-receiving device 3a, respectively. The array direction D11, the array direction D12, the cleavage direction D21, and the cleavage direction D22 extend along the light-receiving surface Sfa.

The array-type light-receiving device 3a includes a substrate 30 and a stacked semiconductor layer 31a. The stacked semiconductor layer 31a includes an optical absorption layer 33a. The stacked semiconductor layer 31a further includes the light-receiving surface Sfa, the pixels GRa, and a plurality of mesa portions M. The mesa portions M are disposed on the substrate 30. Each of the pixels GRa is defined by the corresponding mesa portion M. The pixels GRa are separated from each other by a groove disposed between the mesa portions M.

The array-type light-receiving device 3a further includes an antireflection coating film 8, a passivation film 36a, a p-electrode 37, a n-electrode 38, and a wiring electrode 39. The antireflection coating film 8 is disposed on the back side of the substrate 30 (a surface opposite the stacked semiconductor layer 31a). The stacked semiconductor layer 31a further includes a buffer layer 32. Each of the mesa portions M includes the optical absorption layer 33a, a semiconductor layer 34a, a capping layer 35a, and a p-type region Ra. The buffer layer 32 is disposed on the substrate 30, and the mesa portions M are disposed on the buffer layer 32. The optical absorption layer 33a is disposed on the buffer layer 32. The semiconductor layer 34a is disposed on the optical absorption layer 33a. The capping layer 35a is disposed on the semiconductor layer 34a. The p-electrode 37 is disposed on the capping layer 35a. The p-type region Ra extends from a surface of the capping layer 35a to the interior of the semiconductor layer 34a. A p-n junction is formed in the semiconductor layer 34a. The p-type region Ra may extend from the surface of the capping layer 35a to a middle of the optical absorption layer 33a through the semiconductor layer 34a. In this case, a p-n junction is provided near the upper portion of the optical absorption layer 33a. The p-electrode 37 is in contact with the p-type region Ra in the capping layer 35a. The passivation film 36a covers the mesa portions M. The n-electrode 38 is disposed on an outer edge of the array-type light-receiving device 3a and is in contact with the buffer layer 32. The n-electrode 38 is lead to the height of the p-electrode 37 by the wiring electrode 39. The p-electrode 37 of each of the mesa portions M is connected to an electrode 52 of the read-out circuit 5 through the corresponding bump P. The read-out circuit 5 includes a substrate 51 and a plurality of electrodes 52 disposed on the substrate 51. Each of the electrodes 52 is connected to the corresponding p-electrode 37 of the mesa portions M through the corresponding bump P.

Figure 1B:
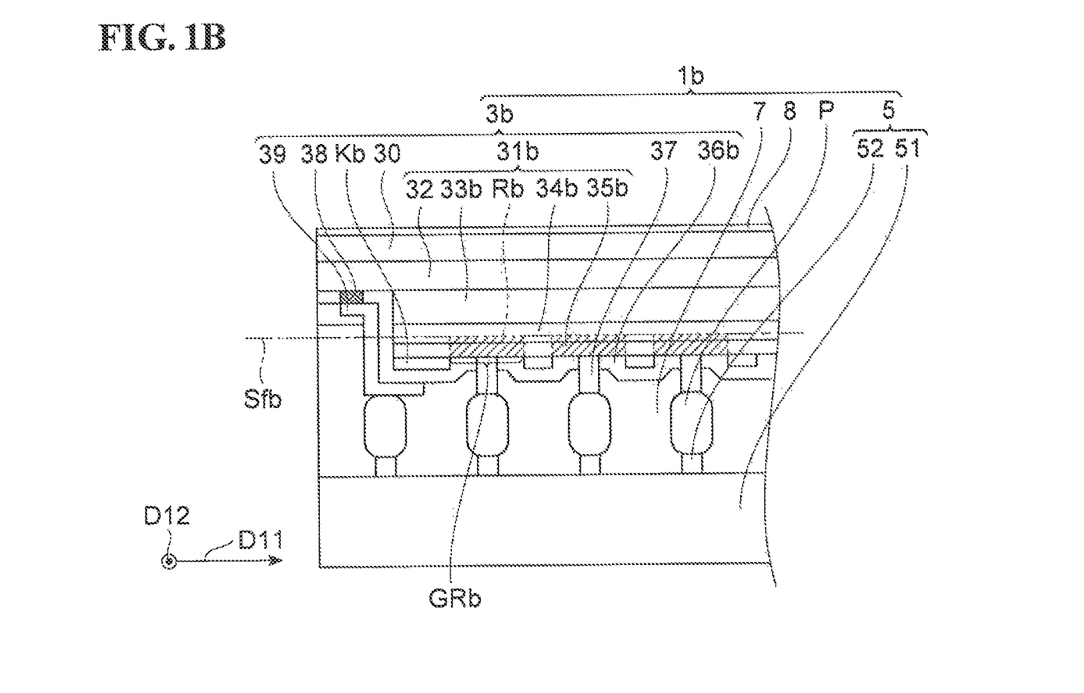

An optical detector 1b illustrated in FIG. 1B includes an array-type light-receiving device 3b, a read-out circuit 5, an underfill resin 7, and a plurality of bumps P. The array-type light-receiving device 3b includes a light-receiving surface Sfb, a plurality of pixels GRb, and a plurality of p-type selective diffusion regions Rb. The read-out circuit 5 is fixed to the array-type light-receiving device 3b through the bumps P. The bumps P are disposed between the array-type light-receiving device 3b and the read-out circuit 5. The underfill resin 7 is disposed between the array-type light-receiving device 3b, the read-out circuit 5, and the bumps P. Each of the pixels GRb of the array-type light-receiving device 3b is defined by the corresponding p-type selective diffusion region Rb. FIG. 1B is a schematic view of the interior of the optical detector 1b along a plane perpendicular to a plane defined by the array directions D11 and D12 of the pixels GRb (a plane parallel to the light-receiving surface Sfb). The light-receiving surface Sfb extends along a plane defined by the array direction D11 and the array direction D12. As illustrated in FIG. 2, the pixels GRb are arranged in a tetragonal lattice on the light-receiving surface Sfb along the array direction D11 and the array direction D12 that intersect at right angles. As viewed from above the light-receiving surface Sfb, the array direction D11 and the array direction D12 are tilted relative to a cleavage direction D21 and a cleavage direction D22 of the array-type light-receiving device 3b, respectively. The array direction D11, the array direction D12, the cleavage direction D21, and the cleavage direction D22 extend along the light-receiving surface Sfb.

The array-type light-receiving device 3b includes a substrate 30 and a stacked semiconductor layer 31b. The stacked semiconductor layer 31b includes an optical absorption layer 33b. The stacked semiconductor layer 31b further includes the light-receiving surface Sfb, the pixels GRb, and a p-type selective diffusion region Rb of p-type impurities. Each of the pixels GRb is defined by the p-type selective diffusion region Rb.

The array-type light-receiving device 3b further includes an antireflection coating film 8, a passivation film 36b, a p-electrode 37, a n-electrode 38, a wiring electrode 39, and a mask Kb. In the embodiment, the mask serves as a selective diffusion mask. The antireflection coating film 8 is disposed on the back side of the substrate 30 (a surface opposite the stacked semiconductor layer 31b). The stacked semiconductor layer 31b further includes a buffer layer 32, the optical absorption layer 33b, a semiconductor layer 34b, and a capping layer 35b. The buffer layer 32 is disposed on the substrate 30. The optical absorption layer 33b is disposed on the buffer layer 32. The semiconductor layer 34b is disposed on the optical absorption layer 33b. The capping layer 35b is disposed on the semiconductor layer 34b. The p-electrode 37 is disposed on the capping layer 35b. The p-type selective diffusion region Rb extends from a surface of the capping layer 35b to the interior of the semiconductor layer 34b. A p-n junction is formed in the semiconductor layer 34b. The p-type region Rb may extend from the surface of the capping layer 35b to a middle of the optical absorption layer 33b through the semiconductor layer 34b. In this case, a p-n junction may be provided near the upper portion of the optical absorption layer 33b. The p-electrode 37 is in contact with the p-type selective diffusion region Rb in the capping layer 35b. The passivation films 36b cover the capping layers 35b. The n-electrode 38 is disposed along an outer edge of the array-type light-receiving device 3b and is in contact with the buffer layer 32. The n-electrode 38 is lead to the height of the p-electrode 37 by the wiring electrode 39. The p-electrode 37 of each of the p-type selective diffusion regions Rb is connected to an electrode 52 of the read-out circuit 5 through the corresponding bump P. The read-out circuit 5 includes a substrate 51 and a plurality of electrodes 52 disposed on the substrate 51. Each of the electrodes 52 is connected to the corresponding p-electrode 37 of the p-type selective diffusion regions Rb through the corresponding bump P.

The substrate 30 has a principal surface having a (100) plane orientation. The substrate 30 has a thickness of approximately 50 μm, for example. The stacked semiconductor layer 31a of the array-type light-receiving device 3a or the stacked semiconductor layer 31b of the array-type light-receiving device 3b is disposed on the principal surface of the substrate 30.

The substrate 30 includes an Fe-doped semi-insulating InP substrate or a n-type InP substrate doped with S as a n-type impurity. In this case, the buffer layer 32 is formed of n-type InP. The optical absorption layer 33a of the array-type light-receiving device 3a and the optical absorption layer 33b of the array-type light-receiving device 3b are formed of an undoped semiconductor and include a type-II InGaAs/GaAsSb multi quantum well (MQW) structure (250 pairs of 5 n/5 nm) or a type-II GaInNAs/GaAsSb multi quantum well (MQW) structure (250 pairs of 5 nm/5 nm).

The substrate 30 may include a n-type GaSb substrate doped with a Te impurity. In this case, the buffer layer 32 is formed of n-type GaSb. The optical absorption layer 33a of the array-type light-receiving device 3a and the optical absorption layer 33b of the array-type light-receiving device 3b are undoped and include a type-II InAs/GaSb multi quantum well (MQW) structure (300 pairs of 2.8 nm/2.1 nm) or a type-II InAsSb/InGaSb multi quantum well (MQW) structure (300 pairs of 2.8 nm/2.1 nm).

The buffer layer 32 has a thickness of approximately 0.2 μm, for example. The impurity concentration of the buffer layer 32 ranges from $1 \times 10^{18}$ to $3 \times 10^{18}$ cm$^{-3}$.

The semiconductor layer 34a of the array-type light-receiving device 3a and the semiconductor layer 34b of the array-type light-receiving device 3b is made of InGaAs and has a thickness of approximately 1 μm. The capping layer 35a of the array-type light-receiving device 3a and the capping layer 35b of the array-type light-receiving device 3b is made of InP and has a thickness of approximately 0.8 μm. The p-type region Ra of the array-type light-receiving device 3a contains a Zn impurity as a p-type impurity and extends from a surface of the capping layer 35a to the interior of the semiconductor layer 34a. The p-type selective diffusion regions Rb of the array-type light-receiving device 3b contains a Zn impurity as a p-type impurity and extends from a surface of the capping layer 35b to the interior of the semiconductor layer 34b.

Figure 3A:
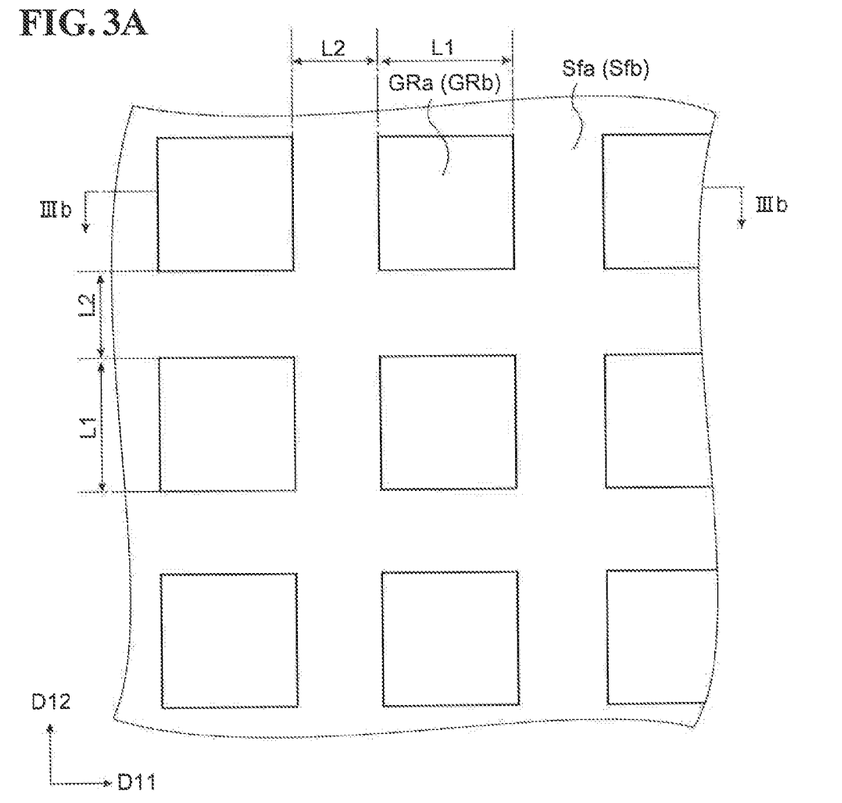
FIG. 3A schematically shows a plan view of the array-type light-receiving device.
Figure 3B:
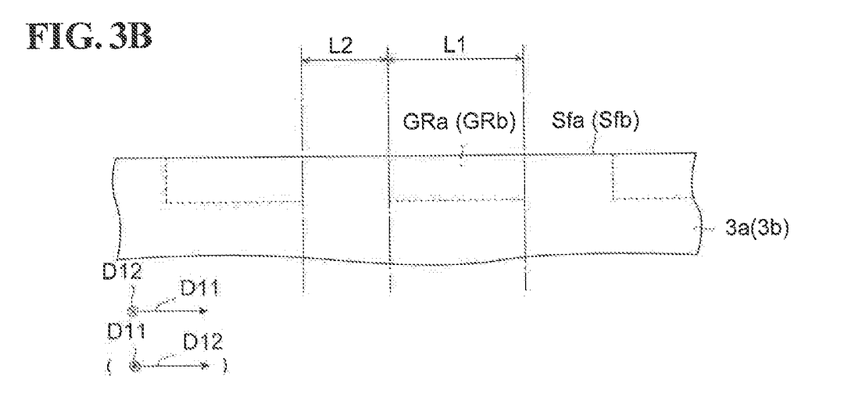
FIG. 3B schematically shows a cross section of the array-type light-receiving device taken along a line IIIb-IIIb shown in FIG. 3A.

FIG. 3A schematically shows a plan view of the array-type light-receiving device, as viewed from above the light-receiving surface Sfa (or the light-receiving surface Sfb). FIG. 3B schematically shows a cross section of the array-type light-receiving device taken along a line IIIb-IIIb shown in FIG. 3A. In FIGS. 3A and 3B, L1 denotes a length of one side of each of the pixels GRa (or the pixels GRb) in a reference direction, which is the array direction D11 or the array direction D12. Each of the pixels GRa (or the pixels GRb) has a substantially square shape with the length L1 of one side, as viewed from above the light-receiving surface Sfa (or the light-receiving surface Sfb) (see FIG. 3A). L2 denotes the distance between adjacent pixels of the pixels GRa (or the pixels GRb) in the reference direction. In addition, α denotes an acute angle between the reference direction and the cleavage direction D21 or the cleavage direction D22 (see FIG. 2). L1, L2, and α satisfy the formula: $L2/L1 \leq \tan(\alpha) \leq L1/L2$, wherein $\tan(\alpha)$ denotes the tangent of the angle α. In this case, the cleavage direction D21 or the cleavage direction D22 passes over at least one of the pixels GRa (or the pixels GRb). It is found that cracks are easily introduced along the cleavage direction (for example, [011] or [0-11] crystallographic direction of the substrate having a (100) plane as the principal surface) in a space between the pixels GRa (or the pixels GRb). In the embodiment, the pixels GRa (or the pixels GRb) arranged along the along the array direction D11 and the array direction D12 prevent cracks from being generated into the array-type light-receiving device 3a (or the array-type light-receiving device 3b). Therefore, the array-type light-receiving device 3a (or the array-type light-receiving device 3b) has improved rigidity.

The array-type light-receiving device 3a includes 320×256 pixels GRa. The array-type light-receiving device 3b also includes 320×256 pixels GRb. The length L1 of one side of the pixel GRa (or pixel GRb) is approximately 20 μm, and the length L2 is approximately 5 μm. The angle α is 45 degrees, for example.

As illustrated in FIG. 2, the array direction D11 and the array direction D12 intersect at right angles. The cleavage direction D21 and the cleavage direction D22 intersect at right angles. The array direction D11 and the cleavage direction D21 form an acute angle α. The array direction D12 and the cleavage direction D22 form an acute angle α. The array directions of the pixels GRa and the array directions of the pixels GRb are represented by the array direction DI 1 and the array direction D12. The cleavage directions of the array-type light-receiving device 3a and the cleavage directions of the array-type light-receiving device 3b are represented by the cleavage direction D21 and the cleavage direction D22.

In the array-type light-receiving device 3a (the array-type light-receiving device 3b) having the structure as described above, the array direction D11 and the array direction D12 of the pixels GRa (pixels GRb) do not coincide with the cleavage direction D21 and the cleavage direction D22 of the array-type light-receiving device 3a (the array-type light-receiving device 3b), as viewed from above the light-receiving surface Sfa (the light-receiving surface Sfb). More specifically, the array direction D11 and the array direction D12 of the pixels GRa (pixels GRb) are tilted at an angle α relative to the cleavage direction D21 and the cleavage direction D22, respectively. Thus, the array-type light-receiving device 3a (the array-type light-receiving device 3b) has improved rigidity when the pixels GRa (pixels GRb) are fixed to the read-out circuit 5 through the bumps P. Even when the thermal expansion coefficients of a semiconductor material of the array-type light-receiving device 3a (the array-type light-receiving device 3b) and a material of the read-out circuit 5 are different from each other, cracking of the array-type light-receiving device 3a (array-type light-receiving device 3b) is prevented, and the yields of these devices are improved.

Figure 4A:
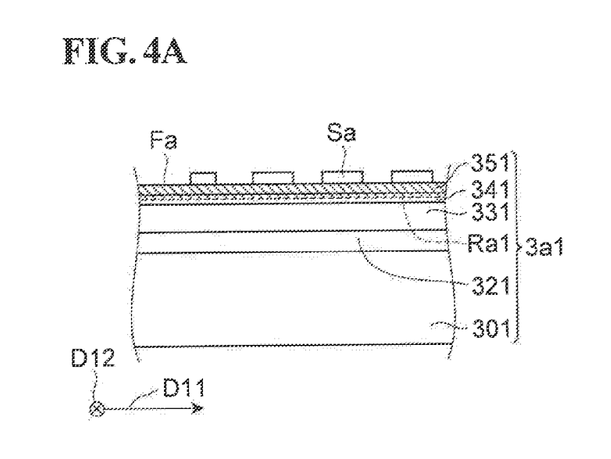
FIGS. 4A to 4D are explanatory views of a method for producing a mesa-type array-type light-receiving device according to an embodiment of the present invention.

Mains steps of a method for producing the optical detector 1a will be described below with reference to FIGS. 4A to 5D. As illustrated in FIG. 4A, a wafer 3a1 is prepared. A mask Sa is formed on a surface Fa of the wafer 3a1. The wafer 3a1 includes a substrate 301 and a stacked semiconductor layer on the substrate. The stacked semiconductor layer includes a buffer layer 321, an optical absorption layer 331, a semiconductor layer 341, a capping layer 351. The stacked semiconductor layer also includes a p-type region Ra1 extending from the capping layer 351 to a middle of the semiconductor layer 341. The buffer layer 321, the optical absorption layer 331, the semiconductor layer 341, and the capping layer 351 are epitaxially grown in order on a principal surface of the substrate 301 by a MOVPE method. These semiconductor layers are lattice-matched to the substrate 301. The p-type region Ra1 is formed by diffusing Zn impurity from the capping layer 351 to the semiconductor layer 341. In the process of diffusing Zn impurity, the wafer 3a1 is charged in a quartz ampule together with $Zn_3P_2$, and the wafer 3a1 is then heat-treated at a temperature of 500° C. for approximately 45 minutes. The $Zn_3P_2$ is a diffusion source material for Zn. As described above, the p-n junction is formed in the semiconductor layer 341. The p-type region Ra1 may extend from the surface of the capping layer 351 to a middle of the optical absorption layer 331 through the semiconductor layer 341. In this case, a p-n junction may be provided near the upper portion of the optical absorption layer 331. Alternatively, the p-type region Ra1 may be formed by Zn doping during epitaxial growth.

The principal surface of the substrate 301 has a (100) plane orientation. The substrate 301 has a diameter of 2 inches and a thickness of approximately 350 μm, for example. The substrate 301 corresponds to the substrate 30 of the array-type light-receiving device 3a.

The buffer layer 321, the optical absorption layer 331, the semiconductor layer 341, and the capping layer 351 correspond to the buffer layer 32, the optical absorption layer 33a, the semiconductor layer 34a, and the capping layer 35a of the array-type light-receiving device 3a, respectively. The p-type region Ra1 corresponds to the p-type region Ra of the array-type light-receiving device 3a.

Figure 8:
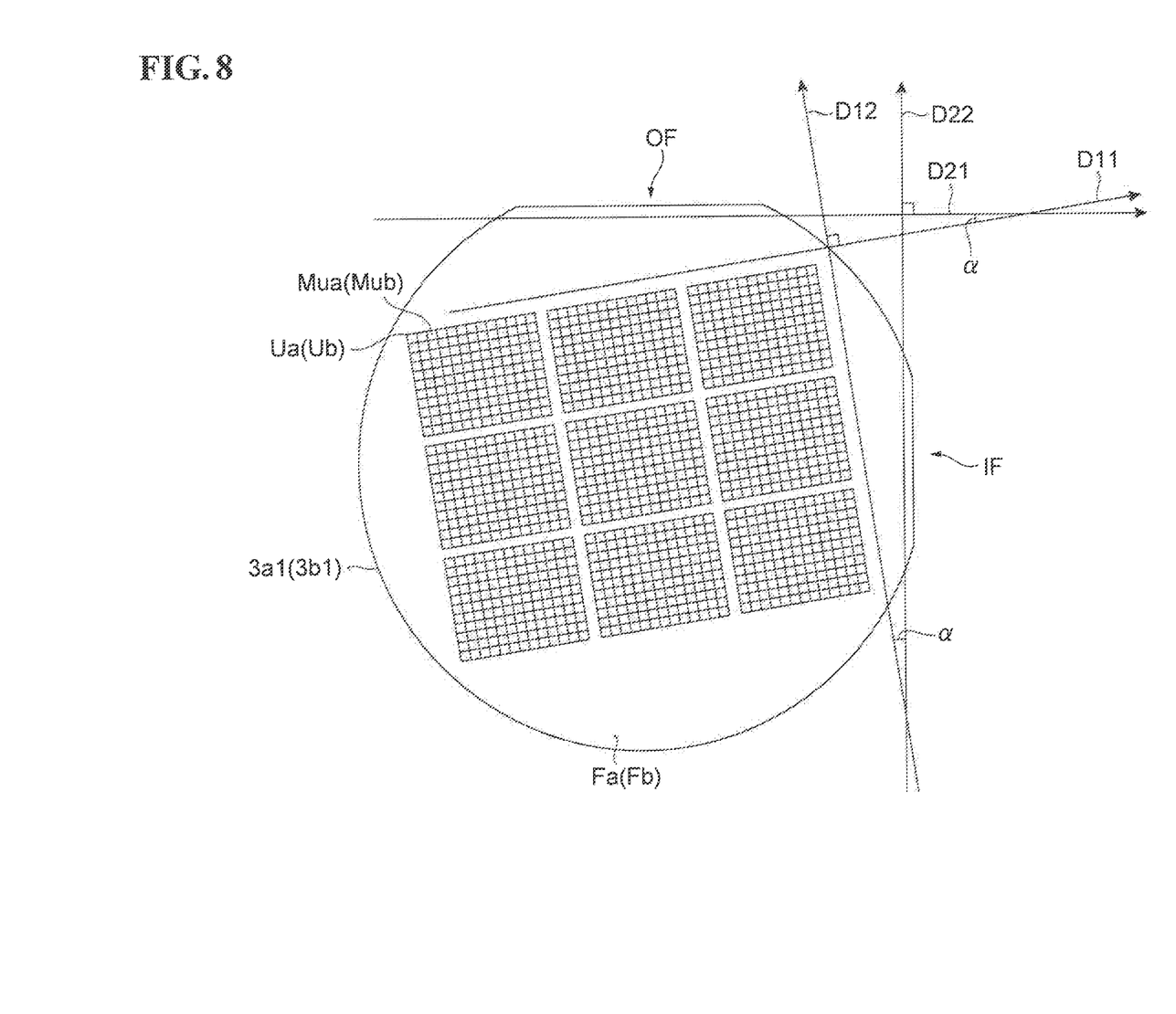
FIG. 8 is an explanatory view of the relationship between the pixel array directions and the wafer cleavage directions on a wafer on which an array-type light-receiving device according to an embodiment of the present invention is formed.

The mask Sa has a thickness of approximately 0.3 μm. The mesa portions M of the array-type light-receiving device 3a are formed by etching the stacked semiconductor layer using the mask Sa. The mask Sa is formed of a silicon nitride (SiN) film, for example. As illustrated in FIG. 8, the mask Sa has a mask pattern including a plurality of rectangular mask regions Mua. In order to form the mask pattern, first, a silicon nitride (SiN) film is formed on the surface Fa of the wafer 3a1 by a plasma chemical vapor deposition (CVD) method. A predetermined pattern is then formed by a photolithography method. The mask regions Mua of the mask Sa are divided into approximately 9 units Ua each having the same structure. Each of the units Ua also includes a plurality of mask regions Mua. The mask regions Mua in each of the units Ua on the surface Fa are two-dimensionally arranged along the array direction D11 and the array direction D12 so as to correspond to the arrangement of the mesa portions M of the array-type light-receiving device 3a. Each of the units Ua includes 320× 255 mask regions Mua. The mask regions Mua have a side length of approximately L1 in the reference direction, which is the array direction D11 or the array direction D12. The distance between adjacent mask regions Mua in the reference direction is approximately L2. The mask regions Mua have substantially the same planar shape as a top surface M1 of the mesa portions M.

The array direction D11 and the cleavage direction D21 form an acute angle α. The array direction D12 and the cleavage direction D22 form an acute angle α. The cleavage direction D21 and the cleavage direction D22 are cleavage directions of the wafer 3a1 and are the same as the cleavage directions of the array-type light-receiving device 3a. The cleavage direction D21 is perpendicular to an index flat (IF) surface (0-11) of the wafer 3a1. The cleavage direction D22 is perpendicular to an orientation flat (OF) surface (0-1-1) of the wafer 3a1.

Figure 4B:
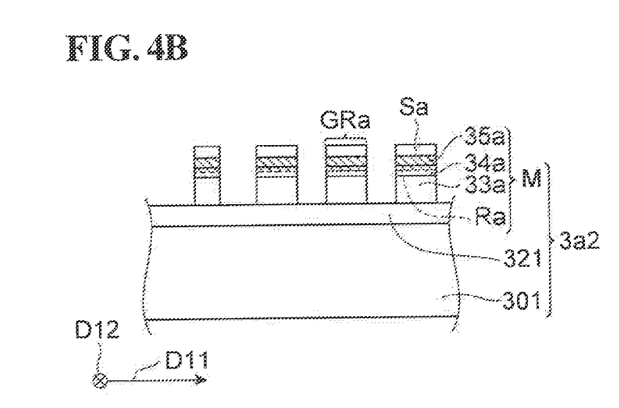

As illustrated in FIG. 4B, the stacked semiconductor layer in the wafer 3a1 is then etched through the mask Sa to form a wafer 3a2 including a plurality of mesa portions M. The optical absorption layer 33a is formed from the optical absorption layer 331 by etching. The semiconductor layer 34a is formed from the semiconductor layer 341. The capping layer 35a is formed from the capping layer 351. The mesa portions M correspond to the pixels GRa. Each of the units Ua includes a 320×256 array of the mesa portions M.

Figure 4C:
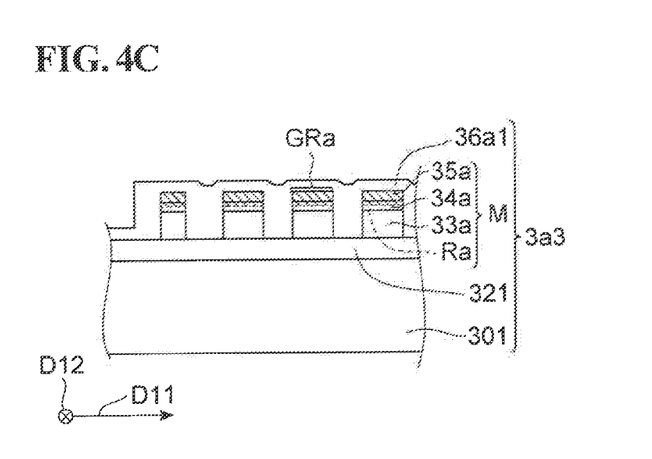

As illustrated in FIG. 4C, after the mask Sa is removed from the wafer 3a2, the side surfaces and the top surface M1 of the mesa portions M and a surface of the buffer layer 321 exposed by etching are covered with a passivation film 36a1. Thus, a wafer 3a3 including the passivation film 36a1 is formed.

Figure 4D:
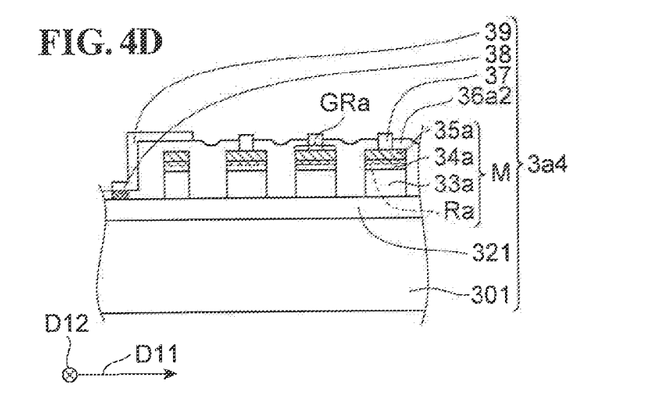

As illustrated in FIG. 4D, a plurality of openings is then formed in the passivation film 36a1 of the wafer 3a3, thereby forming a passivation film 36a2 from the passivation film 36a1. A plurality of p-electrodes 37 is formed in the openings of the passivation film 36a2. An n-electrode 38 is formed along an outer edge of the units Ua in contact with the buffer layer 321 through the opening of the passivation film 36a2. A wiring electrode 39 is also formed to connect the n-electrode 38 to an electrode of the read-out circuit through a bump. Thus, a wafer 3a4 including the p-electrodes 37, the n-electrode 38, and the wiring electrode 39 is formed. Each of the p-electrodes 37 is disposed on the corresponding top surface M1 of the mesa portions M and is in contact with the corresponding mesa portion M. The n-electrode 38 is lead to the height of the p-electrode 37 by the wiring electrode 39.

Figure 5A:
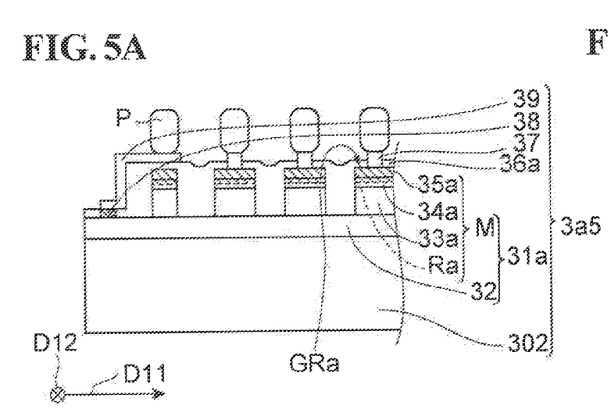
FIGS. 5A to 5D are explanatory views of a method for producing a mesa-type array-type light-receiving device according to an embodiment of the present invention.

As illustrated in FIG. 5A, a plurality of bumps P is then formed on the p-electrodes 37 and the wiring electrode 39 of the wafer 3a4, and each of the units Ua is cut out by dicing. One of the units Ua thus cut out is a chip 3a5 illustrated in FIG. 5A. The passivation film 36a is formed from the passivation film 36a2 of the wafer 3a4. The buffer layer 32 is formed from the buffer layer 321. The substrate 302 is formed from the substrate 301.

Figure 5B:
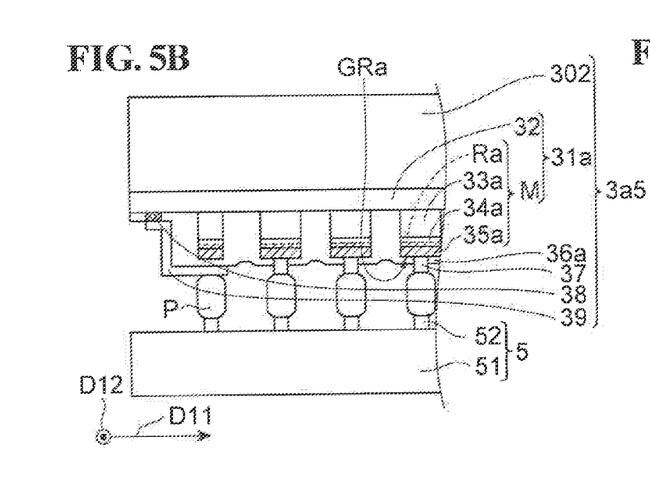

As illustrated in FIG. 5B, the chip 3a5 is then coupled to the read-out circuit 5. A plurality of electrodes 52 of the read-out circuit 5 is coupled to the p-electrodes 37 and the n-electrode 38 of the chip 3a5 through the bumps P. Thus, the chip 3a5 is fixed to the read-out circuit 5 through the bumps P.

Figure 5C:
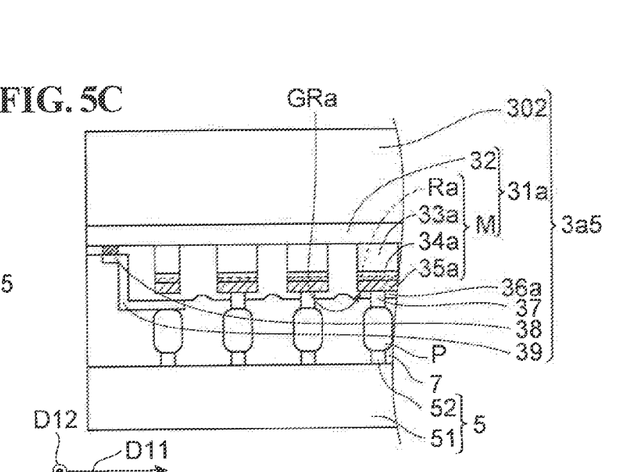
Figure 5D:
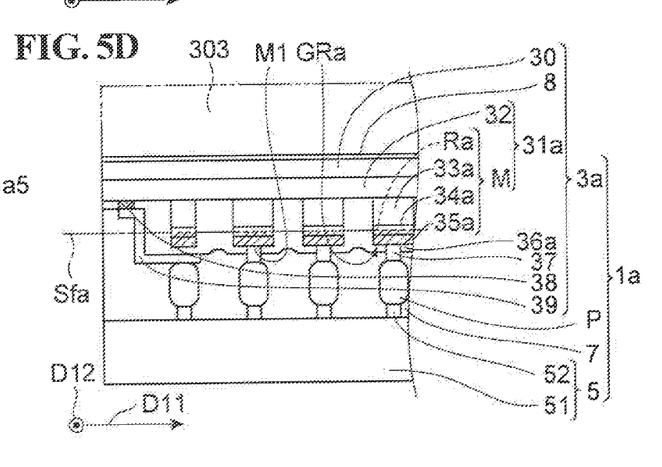

As illustrated in FIG. 5C, a space between the read-out circuit 5, the chip 3a5, and the bumps P is filled with the underfill resin 7. As illustrated in FIG. 5D, the back side of the substrate 302 is then ground to remove a region 303 from the substrate 302, thereby decreasing the thickness of the substrate 302. Thus, the substrate 30 is formed from the substrate 302. The substrate 30 is formed from the substrate 302, and thereby the array-type light-receiving device 3a is formed from the chip 3a5. Through the steps illustrated in FIGS. 4A to 5D, the optical detector 1a including the array-type light-receiving device 3a, the read-out circuit 5, the underfill resin 7, and the bumps P is formed.

Figure 6A:
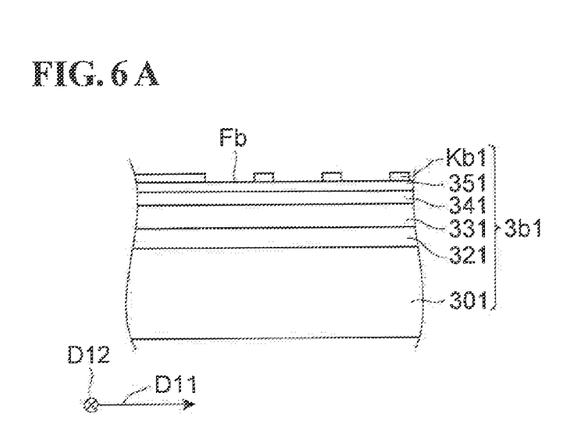
FIGS. 6A to 6D are explanatory views of a method for producing a diffusion-type array-type light-receiving device according to an embodiment of the present invention.

Mains steps of a method for producing the optical detector 1b will be described below with reference to FIGS. 6A to 7D. As illustrated in FIG. 6A, a wafer 3b1 is prepared. A mask Kb1 is formed on a surface Fb of the wafer 3b1. The mask Kb1 has a plurality of openings to form a p-type selective diffusion regions Rb. The wafer 3b1 includes a substrate 301 and a stacked semiconductor layer on the substrate. The stacked semiconductor layer includes a buffer layer 321, an optical absorption layer 331, a semiconductor layer 341, a capping layer 351. The buffer layer 321, the optical absorption layer 331, the semiconductor layer 341, and the capping layer 351 are epitaxially grown in order on a principal surface of the substrate 301 by a MOVPE method and are lattice-matched to the substrate 301.

The substrate 301 corresponds to the substrate 30 of the array-type light-receiving device 3b. The buffer layer 321, the optical absorption layer 331, the semiconductor layer 341, and the capping layer 351 correspond to the buffer layer 32, the optical absorption layer 33b, the semiconductor layer 34b, and the capping layer 35b of the array-type light-receiving device 3b, respectively.

The mask Kb1 has a thickness of approximately 0.1 μm. The p-type selective diffusion regions Rb of the array-type light-receiving device 3b are formed using the mask Kb1. The mask Kb1 is formed of a silicon nitride (SiN) film, for example. As illustrated in FIG. 8, the mask Kb1 has a mask pattern including a plurality of rectangular mask regions Mub. In order to form the mask pattern, first, a silicon nitride (SiN) film is formed on the surface Fb of the wafer 3b1 by a plasma chemical vapor deposition (CVD) method. A predetermined pattern is then formed by a photolithography method. The mask regions Mub of the mask Kb1 are divided into approximately 9 units Ub each having the same structure. Each of the units Ub also includes a plurality of mask regions Mub. A plurality of openings defined by the mask regions Mub in each of the units Ub on the surface Fb is two-dimensionally arranged along the array direction D11 and the array direction D12 so as to correspond to the arrangement of the p-type selective diffusion regions Rb of the array-type light-receiving device 3b. Each of the units Ub includes 320×255 openings that are defined by the mask regions Mub.

The mask regions Mub have a side length of approximately L1 in the reference direction, which is the array direction D11 or the array direction D12. The distance between adjacent mask regions Mub in the reference direction is approximately L2. The openings defined by the mask regions Mub have substantially the same planar shape as the p-type selective diffusion regions Rb. The array direction D11 and the cleavage direction D21 form an acute angle α. The array direction D12 and the cleavage direction D22 form an acute angle α. The cleavage direction D21 and the cleavage direction D22 are cleavage directions of the wafer 3b1 and are the same as the cleavage directions of the array-type light-receiving device 3b. The cleavage direction D21 is perpendicular to an index flat (IF) surface (0-11) of the wafer 3b1. The cleavage direction D22 is perpendicular to an orientation flat (OF) surface (0-1-1) of the wafer 3b1.

Figure 6B:
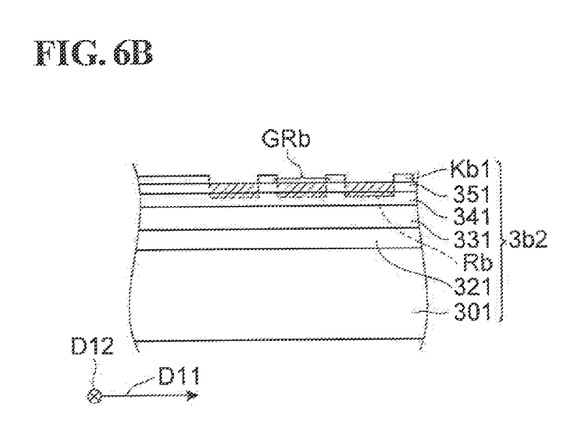

As illustrated in FIG. 6B, a plurality of p-type selective diffusion regions Rb is then formed on the surface Fb using the mask Kb1. Thus, a wafer 3b2 including the p-type selective diffusion regions Rb is formed. The p-type selective diffusion regions Rb are formed by selectively diffusing Zn impurity from the capping layer 351 to the semiconductor layer 341 through the openings of the mask Kb1. In the process of selectively diffusing Zn impurity, the wafer 3b1 is charged in a quartz ampule together with $Zn_3P_2$, and the wafer 3b1 is then heat-treated at a temperature of 500° C. for approximately 45 minutes. The $Zn_3P_2$ is a diffusion source material for Zn. As described above, the p-n junction is formed in the semiconductor layer 341. The p-type selective diffusion region Rb may extend from the surface of the capping layer 351 to a middle of the optical absorption layer 331 through the semiconductor layer 341. In this case, a p-n junction may be provided near the upper portion of the optical absorption layer 331.

Figure 6C:
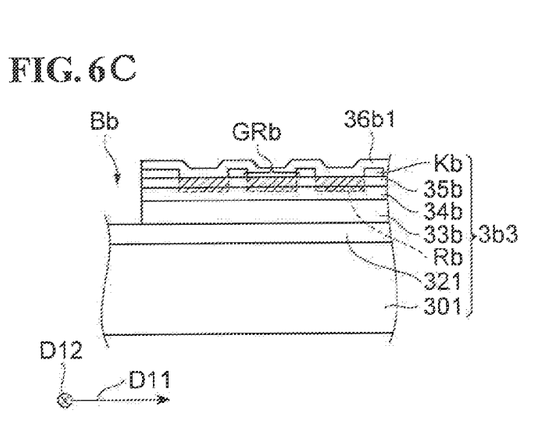

As illustrated in FIG. 6C, in order to form a trench Bb for defining the units Ub, the surface Fb is then covered with a mask 36b1 except for a portion on which the trench Bb is to be formed. The trench Bb is then formed by etching the stacked semiconductor layer in the wafer 3b2 through the mask 36b1. Thus, a wafer 3b3, which includes the trench Bb in the wafer 3b2, is formed. The optical absorption layer 33b is formed from the optical absorption layer 331 by etching. The semiconductor layer 34b is formed from the semiconductor layer 341. The capping layer 35b is formed from the capping layer 351. The mask Kb is formed from the mask Kb1.

Figure 6D:
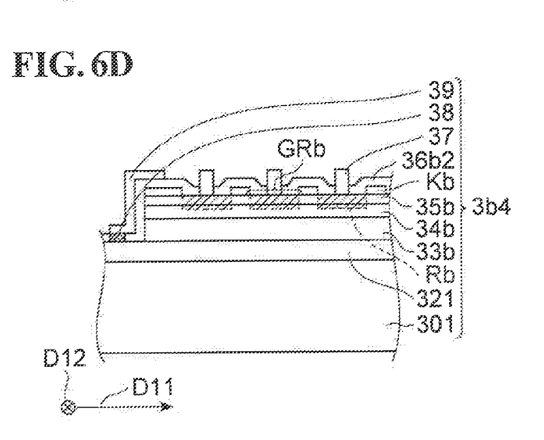

The mask 36b1 is then removed from the wafer 3b3. As illustrated in FIG. 6D, the surface Fb and the trench Bb are covered with a passivation film 36b2 having a plurality of openings. A plurality of p-electrodes 37 is formed in the openings of the passivation film 36b2. An n-electrode 38 is formed along an outer edge of the units Ub in contact with the buffer layer 321 through the opening of the passivation film 36b2. A wiring electrode 39 is also formed to connect the n-electrode 38 to an electrode of the read-out circuit through a bump. Thus, a wafer 3b4 including the p-electrodes 37, the n-electrode 38, and the wiring electrode 39 is formed. Each of the p-electrodes 37 is disposed on the corresponding p-type selective diffusion region Rb and is in contact with the corresponding p-type selective diffusion region Rb. The n-electrode 38 is lead to the height of the p-electrode 37 by the wiring electrode 39.

Figure 7A:
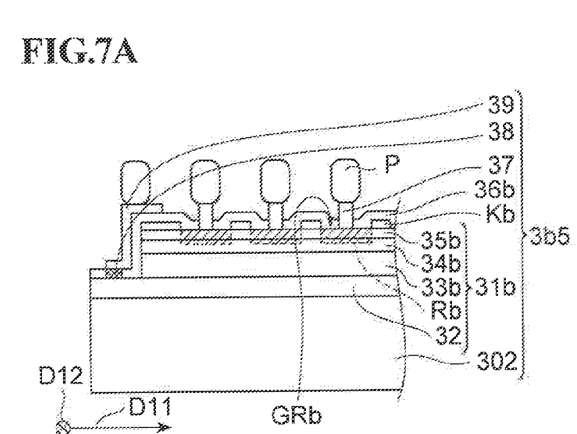
FIGS. 7A to 7D are explanatory views of a method for producing a diffusion-type array-type light-receiving device according to an embodiment of the present invention.

As illustrated in FIG. 7A, a plurality of bumps P is then formed on the p-electrodes 37 and the wiring electrode 39 of the wafer 3b4, and each of the units Ub is cut out by dicing. One of the units Ub thus cut out is a chip 3b5 illustrated in FIG. 7A. The passivation film 36b is formed from the passivation film 36b2 of the wafer 3b4. The buffer layer 32 is formed from the buffer layer 321. The substrate 302 is formed from the substrate 301. In the chip 3b5, a region including the buffer layer 32, the optical absorption layer 33b, the semiconductor layer 34b, the capping layer 35b, and the p-type selective diffusion regions Rb corresponds to the stacked semiconductor layer 31b.

Figure 7B:
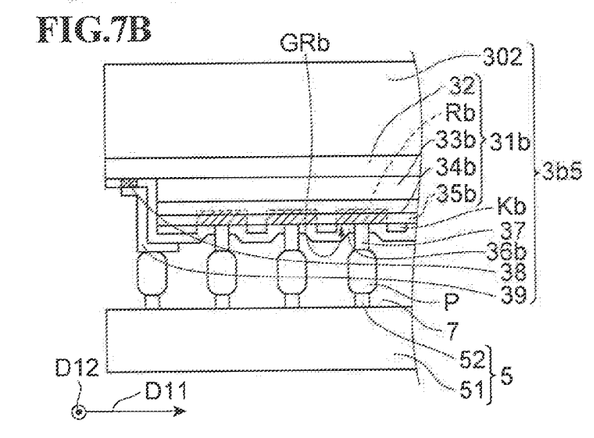

As illustrated in FIG. 7B, the chip 3b5 is then coupled to the read-out circuit 5. A plurality of electrodes 52 of the read-out circuit 5 is coupled to the p-electrodes 37 and the n-electrode 38 of the chip 3b5 through the bumps P. Thus, the chip 3b5 is fixed to the read-out circuit 5 through the bumps P.

Figure 7C:
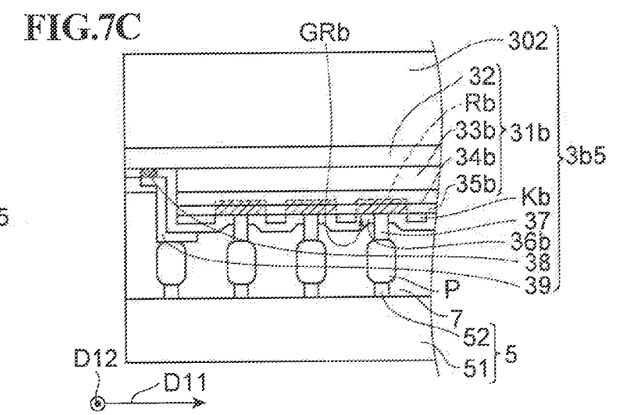
Figure 7D:
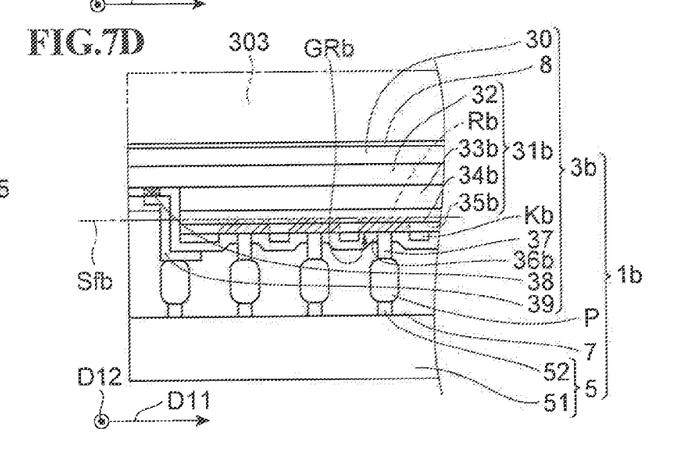

As illustrated in FIG. 7C, a space between the read-out circuit 5, the chip 3b5, and the bumps P is filled with the underfill resin 7. As illustrated in FIG. 7D, the back side of the substrate 302 is then ground to remove a region 303 from the substrate 302, thereby decreasing the thickness of the substrate 302. Thus, the substrate 30 is formed from the substrate 302. The substrate 30 is formed from the substrate 302, and thereby the array-type light-receiving device 3b is formed from the chip 365. Through the steps illustrated in FIGS. 6A to 7D, the optical detector 1b including the array-type light-receiving device 3b, the read-out circuit 5, the underfill resin 7, and the bumps P is formed.

Principles of the present invention have been described on the basis of preferred embodiments with reference to the drawings. However, those skilled in the art will understand that the present invention can be changed in terms of arrangement and details without departing from such principles. The present invention is not limited to the specific configurations disclosed in the embodiments. Therefore, rights related to all modifications and changes within the scope and the spirit of the claims are claimed.

What is claimed is:

1. An array-type light-receiving device comprising:
a semiconductor substrate having a cleavage direction;
a light-receiving surface disposed on the semiconductor substrate; and
a plurality of pixels two-dimensionally arranged on the light-receiving surface in a first array direction and a second array direction, each of the pixels including a stacked semiconductor layer including an optical absorption layer, wherein
the first and second array directions are tilted relative to the cleavage direction of the semiconductor substrate at a predetermined angle α as viewed from above the light-receiving surface, the angle α being formed by a reference direction and the cleavage direction and satisfying the relational expression:

$$L2/L1 \leq \tan(\alpha) \leq L1/L2,$$

in which the reference direction is the first array direction or the second array direction, L1 represents a length of one side of each of the plurality of pixels in the reference direction, L2 represents a distance L2 between adjacent pixels of the plurality of pixels in the reference direction, and tan(α) represents a tangent of the angle α, and
the first and second array directions and the cleavage direction extend along the light-receiving surface.

2. The array-type light-receiving device according to claim 1, further comprising a plurality of mesa portions disposed on the substrate, wherein
each of the mesa portions includes the stacked semiconductor layer,
each of the pixels is defined by a corresponding one of the plurality of mesa portions, and
each of the pixels is separated from other pixels by a groove disposed between the mesa portions.

3. The array-type light-receiving device according to claim 1, wherein
the semiconductor substrate is composed of InP, and
the optical absorption layer includes one of an InGaAs/GaAsSb multi quantum well structure and a GaInNAs/GaAsSb multi quantum well structure.

4. The array-type light-receiving device according to claim 1, wherein
the substrate is composed of GaSb, and
the optical absorption layer includes one of an InAs/GaSb multi quantum well structure and an InAsSb/InGaSb multi quantum well structure.

5. The array-type light-receiving device according to claim 1, further comprising:
a selective diffusion mask disposed on a top surface of the stacked semiconductor layer, the selective diffusion mask including a plurality of openings; and
a plurality of selective diffusion regions extending from the top surface of the stacked semiconductor layer toward the optical absorption layer, wherein
the selective diffusion regions include a p-type impurity diffused from the top surface of the stacked semiconductor layer through the openings of the selective diffusion mask, and
each of the pixels is defined by a corresponding one of the plurality of selective diffusion regions.

* * * * *